US011611010B2

(12) United States Patent
Bosman

(10) Patent No.: US 11,611,010 B2
(45) Date of Patent: Mar. 21, 2023

(54) METHOD FOR PRODUCING MODULES OF THIN FILM PHOTOVOLTAIC CELLS IN A ROLL-TO-ROLL PROCESS AND APPARATUS CONFIGURED FOR USING SUCH A METHOD

(71) Applicant: Nederlandse Organisatie voor toegepast-natuurwetenschappelijk Onderzoek TNO, s-Gravenhage (NL)

(72) Inventor: Johan Bosman, Petten (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 143 days.

(21) Appl. No.: 16/647,052

(22) PCT Filed: Sep. 17, 2018

(86) PCT No.: PCT/NL2018/050613
§ 371 (c)(1),
(2) Date: Mar. 13, 2020

(87) PCT Pub. No.: WO2019/054876
PCT Pub. Date: Mar. 21, 2019

(65) Prior Publication Data
US 2020/0266317 A1   Aug. 20, 2020

(30) Foreign Application Priority Data
Sep. 15, 2017   (NL) ..................... 2019558

(51) Int. Cl.
*H01L 31/0465* (2014.01)
*H01L 31/18* (2006.01)
*H01L 31/0463* (2014.01)

(52) U.S. Cl.
CPC ........ *H01L 31/188* (2013.01); *H01L 31/0463* (2014.12); *H01L 31/0465* (2014.12)

(58) Field of Classification Search
CPC ............... H01L 31/188; H01L 31/0463; H01L 31/0465
See application file for complete search history.

(56) References Cited

U.S. PATENT DOCUMENTS

2008/0314439 A1   12/2008   Misra
2009/0256581 A1*  10/2009   Lu ................... H01L 21/681
                                                198/339.1

(Continued)

FOREIGN PATENT DOCUMENTS

JP   2001168068   6/2001
WO  2010068331   6/2010

(Continued)

*Primary Examiner* — Jae Lee
(74) *Attorney, Agent, or Firm* — N.V. Nederlandsch Octrooibureau

(57) ABSTRACT

A method for producing in a roll-to-roll process modules of thin film photovoltaic cells in a substrate film, the modules including the substrate with a photovoltaic layer inbetween a lower and upper electrode layer, by using an apparatus including a belt conveyor, and scribe and print stations arranged at respective positions along a transport direction of the belt conveyor to create an interconnection structure between the photovoltaic cells including an arrangement of structural elements having one or more conductive and isolating scribe lines and a conductive body connecting adjacent thin film photovoltaic cells. The method includes: creating by the processing stations, the interconnection structure in the moving substrate film; measuring the structural elements and determining parameters of each structural element; based on the parameters establishing a positioning error, associated with a functional defect; based on the error, correcting settings of one or more processing stations and/or the belt conveyor.

16 Claims, 7 Drawing Sheets

(56) References Cited

U.S. PATENT DOCUMENTS

| | | | | |
|---|---|---|---|---|
| 2009/0287446 A1* | 11/2009 | Wang | ............... | H01L 31/042 |
| | | | | 438/73 |
| 2012/0021536 A1* | 1/2012 | Feldman-Peabody | ............... | |
| | | | | H01L 31/208 |
| | | | | 257/E21.528 |
| 2012/0028404 A1* | 2/2012 | Frey | ............... | B23K 26/364 |
| | | | | 257/E31.11 |
| 2013/0249580 A1* | 9/2013 | Dobson | ............... | H02S 50/10 |
| | | | | 324/750.16 |

FOREIGN PATENT DOCUMENTS

| | | |
|---|---|---|
| WO | 2010135321 | 11/2010 |
| WO | 2016102326 | 6/2016 |

* cited by examiner

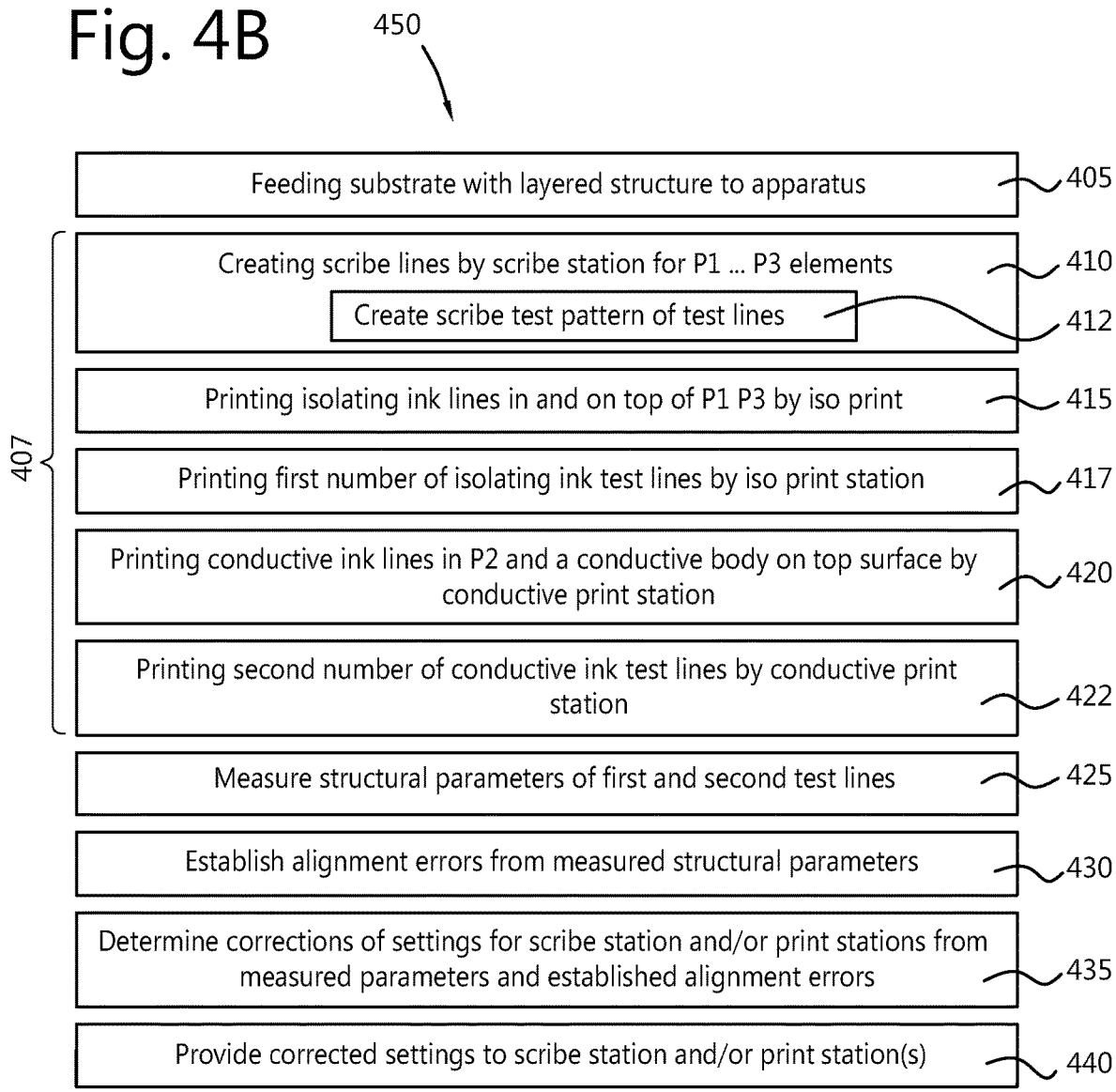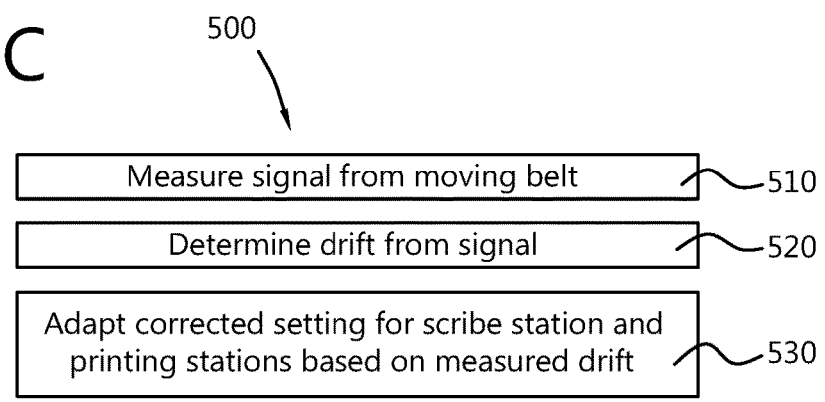

Fig. 7.0 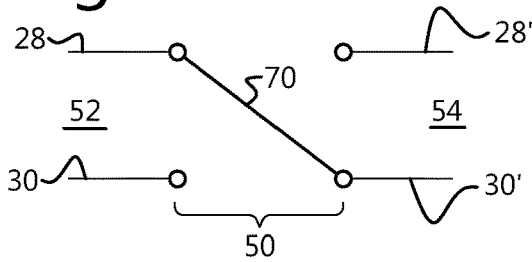
Fig. 7.1 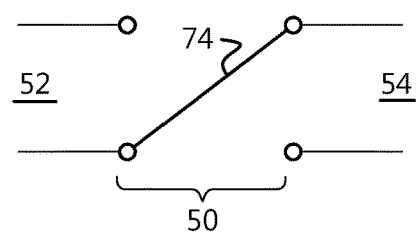
Fig. 7.2 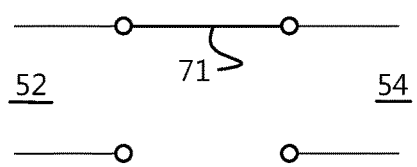
Fig. 7.3 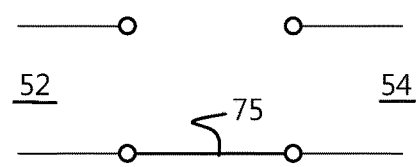
Fig. 7.4 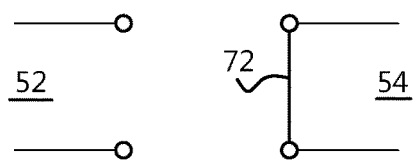
Fig. 7.5 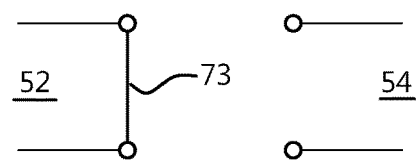
Fig. 7.6 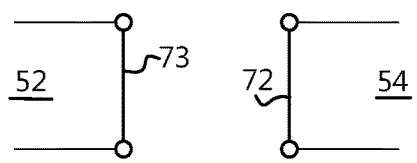
Fig. 7.7 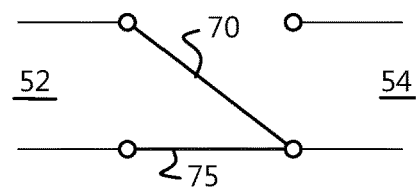
Fig. 7.8 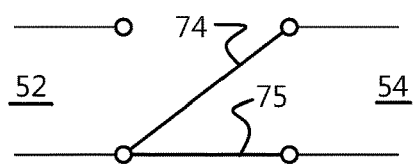
Fig. 7.9 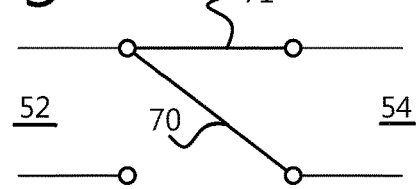

Fig. 7.10
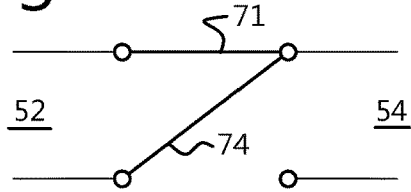
Fig. 7.11
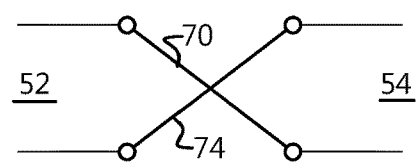
Fig. 7.12
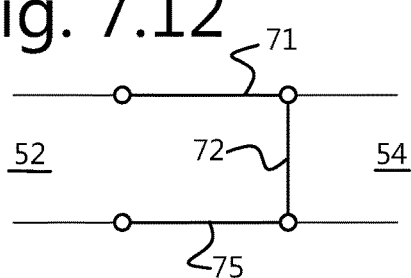
Fig. 7.13
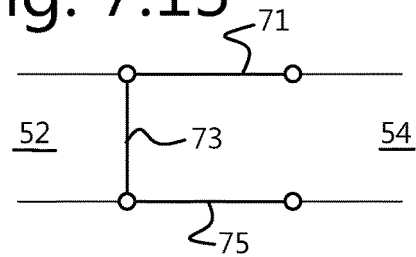
Fig. 7.14
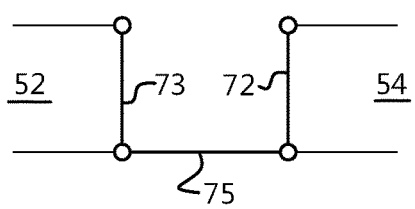
Fig. 7.15
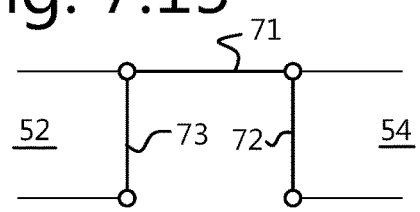
Fig. 7.16
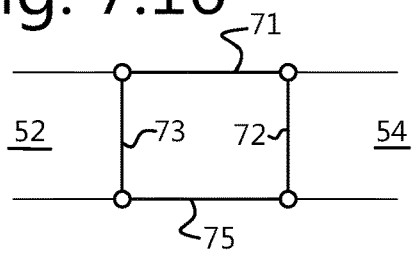
Fig. 7.17
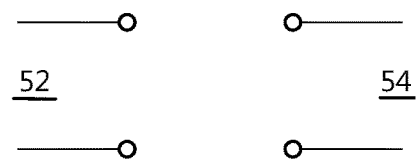
Fig. 7.18
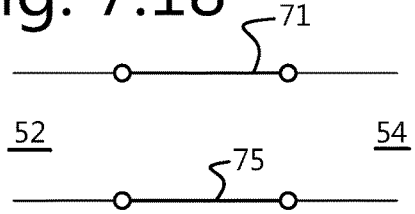

METHOD FOR PRODUCING MODULES OF THIN FILM PHOTOVOLTAIC CELLS IN A ROLL-TO-ROLL PROCESS AND APPARATUS CONFIGURED FOR USING SUCH A METHOD

FIELD OF THE INVENTION

The present invention relates to a method for producing in a roll-to-roll process a photovoltaic module comprising thin film photovoltaic cells. Also, the invention relates to an apparatus configured for using such a method. Moreover, the invention relates to a computer program product.

BACKGROUND

In roll-to-roll manufacturing of a photovoltaic module comprising thin film photovoltaic cells, on a substrate formed as (semi-) continuous strip or a (semi-) continuous foil, a layered structure of a photovoltaic layer sandwiched between at least an upper and a lower electrode layer is created.

Since the substrate is (semi-) continuous, the layered structure on the substrate is divided in individual PV cells, by applying an arrangement of scribe lines. Within this arrangement, the scribe lines are either configured as conductive lines or isolating lines by filling the scribe lines with a conductive material or an isolating material, or using an open scribe line, respectively. Also, conductive or isolating lines can be created directly on other areas of the substrate. In addition, the arrangement can comprise an conductive body that provides interconnection of adjacent individual PV cells.

Typically, in a roll-to-roll process the scribe lines are created by scribe stations that use a laser scanner that generates one or more laser beams to cut the scribe lines in the layered structure. The depth of individual scribe lines can be controlled. Additionally, the structure of the surface and/or the shape of the line can be controlled.

The creation of the conductive or isolating lines is done by printing stations that modify the scribe lines and the surrounding electrodes with either filling and or printing with a conductive ink, phase change ink, dissolvable ink or an isolating ink. In a same manner, the conductive body can be printed to create an interconnecting bridge between adjacent PV cells.

The scribe stations and printing stations are positioned along a transport path of the substrate and are each arranged to provide their respective functions while the substrate passes.

Since the creation of scribe lines and printing ink lines are consecutive and repetitive processes, errors may occur due to changes in one or more of these processes over time. Such errors may be caused for example by drift of equipment, a variation of photovoltaic material properties or properties of conductive ink or isolating ink. Also, insufficient stability of the transport speed may influence the production process as the substrate is moving during these processes.

WO 2010/135321 discloses a method and apparatus for solar cell production line control and process analysis, in which a cluster tool system is adapted to form thin film solar cell devices by accepting a large unprocessed substrate and performing multiple deposition, material removal, cleaning, sectioning, bonding, and various inspection and testing processes to form multiple complete, functional, and tested solar cell devices that can then be shipped to an end user for installation in a desired location to generate electricity.

WO 2010/068331 discloses a vision system for screen printing pattern alignment that is used in solar cell formation process that includes the formation of metal contacts over heavily doped regions that are formed in a desired pattern on a surface of a substrate. An inspection system and supporting hardware is used to reliably position a similarly shaped, or patterned, metal contact structure on the patterned heavily doped regions to allow an Ohmic contact to be made. The metal contact structure, such as fingers and busbars, are formed on the heavily doped regions so that a high quality electrical connection can be formed between these two regions.

It is an object of the present invention to overcome or mitigate one or more of the disadvantages from the prior art.

SUMMARY OF THE INVENTION

The object is achieved by a method for producing in a roll-to-roll process modules of thin film photovoltaic cells in a substrate film on a substrate, the modules comprising the substrate with the substrate film comprising a photovoltaic layer deposited in between a lower and an upper electrode layer, by using an apparatus comprising a belt conveyor and a plurality of processing stations, in which the processing stations comprise scribe stations and print stations and are arranged at respective positions along a transport direction of the belt conveyor in an order to create an interconnection structure between the photovoltaic cells comprising an arrangement of structural elements comprising one or more conductive scribe lines, one or more isolating scribe lines and a conductive body for providing a connection between adjacent thin film photovoltaic cells,
wherein the method comprises: a) transporting the substrate at a predetermined speed along the belt conveyor in the transport direction; b) while the substrate passes the processing stations: creating by means of the processing stations using timing for activation and deactivation of their respective function, the interconnection structure in the substrate film and/or optionally on a portion of the substrate film away from the interconnection structure a test pattern of elongated test structures comprising conductive scribe test lines, isolating scribe test lines and conductive printed test lines with each of the test lines associated with a respective processing station; c) subsequently measuring each of the structural elements in the interconnection structure and determining structural parameters of each of the structural elements, and/or if the test pattern was created, measuring each of the elongated test structures and determining structural parameters of each of the test structures, the structural parameters of each of the structural elements and/or each of the test structures being selected from a group comprising relative position, width, variance of width, relative position of line edges; d) based on the structural parameters establishing an positioning error, which is associated with an occurrence of a functional defect in the serial interconnection structure, and e) based on the established positioning error, providing a correction of settings of one or more of the processing stations and/or the belt conveyor.

Advantageously, the present invention provides a method that uses structural parameters of the photovoltaic cells for correction of the set-up of the roll-to-roll process that produces the photovoltaic cells. The correction involves that the structural parameters are linked to positioning errors. The positioning errors are classified in terms of functional defects that can occur as result of the misalignment between any two processes as performed in the roll-to-roll process by the processing stations.

The method allows to use structural parameters derived either from line shaped elements of either the interconnection structure or test patterns created by the processing stations.

According to an embodiment, the method provides the step of measuring a drift of the predetermined speed of the belt conveyor; determining a timing correction based on the measured drift; and adjusting the timing for activation and for deactivation for each processing station, using the timing correction, or adjusting the speed of the belt conveyor based on the measured drift, wherein the apparatus comprises a marker on the belt of the belt conveyor and a sensing device for sensing the marker on the belt, in which the drift is measured by signals from the sensing device.

In this manner, the method provides that the settings of the process can be adjusted in a same control loop as any positioning error or misalignment caused by the processing stations.

According to an embodiment, the invention provides that at least through hole at a predetermined position is arranged in the belt of the belt conveyor as the marker, and that the measurement of the drift comprises:
generating an optical signal generated by an optical source at a first surface of the belt through the at least one through hole, and detecting a timing of the optical signal by an optical detector at a second surface of the belt opposite to the first surface.

The optical source can be a laser beam generated by the laser scanner of the scribe station.

The timing of the optical signal can be used to measure the position of the laser beam c.q. the laser scanner. Advantageously, this provides a feedback that is directly linked to the scribe station.

If a variation or a deviation of the position occurs that exceeds a predefined threshold, the method provides that a correction is made either to the settings of the belt conveyor or to the settings of the timing for activation or deactivation of the processing stations.

According to an aspect, the invention provides an apparatus comprising a belt conveyor, a feeding station, a collecting station, processing stations, a belt sensor and a controller; the controller comprising a processing unit and a memory, in which the processing unit is coupled to the memory; the controller being communicatively connected with the belt conveyor, the feeding station, the collecting station, the processing stations and the belt sensor for controlling their respective functions; the processing stations comprising at least one scribe station, at least one print station for printing isolating ink, and at least one print station for printing an ink selected from a group comprising conductive ink, phase change ink and dissolvable ink; the system being arranged for producing in a roll-to-roll process thin film photovoltaic cells in a substrate film comprising a substrate or carrier layer with a photovoltaic layer deposited in between a lower and an upper electrode layer, in which the processing stations are arranged at respective positions along a transport direction of the belt conveyor in an order to create a serial interconnection structure between the photovoltaic cells, wherein the controller is configured to receive an established positioning error, which is associated with an occurrence of a functional defect in the serial interconnection structure and to provide, based on the established positioning error, a correction of settings to one or more of the processing stations and/or the belt conveyor.

According to an aspect, the invention provides a computer program product.

BRIEF DESCRIPTION OF DRAWINGS

The invention will be explained in more detail below with reference to drawings in which illustrative embodiments thereof are shown. The drawings are intended exclusively for illustrative purposes and not as a restriction of the inventive concept. The scope of the invention is only limited by the definitions presented in the appended claims.

FIGS. 4A, 4B and 4C show block diagrams for respective methods according to an embodiment of the invention;

DETAILED DESCRIPTION OF EMBODIMENTS

Figure 1:
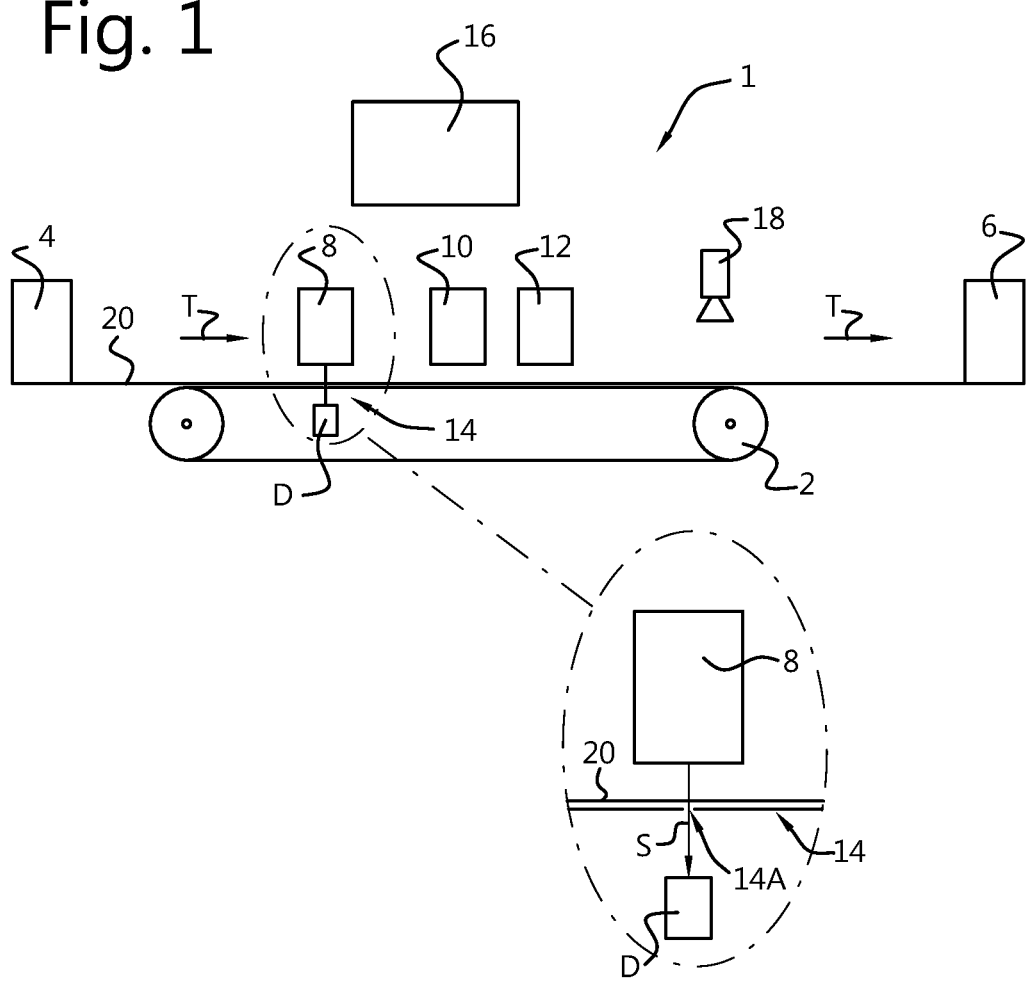
FIG. 1 shows a schematic layout of an apparatus for producing photovoltaic cells in a roll-to-roll process.

FIG. 1 shows a schematic layout of an apparatus for producing modules of thin film photovoltaic cells in a roll-to-roll process in accordance with an embodiment of the present invention.

The apparatus, denoted by reference 1, comprises a belt conveyor 2, a feeding station 4, a collecting station 6, processing stations 8, 10, 12, a belt sensor 14, a controller 16.

In some embodiments, the apparatus 1 also comprises an image recording system 18, for example an electronic camera.

The processing stations comprise at least one scribe station 8, at least one print station 10 for printing isolating ink, and at least one print station 10 for printing an ink. Such an ink can be selected from a group comprising conductive ink and/or phase change ink and/or dissolvable ink, depending on the design of the photovoltaic module comprising thin film photovoltaic cells.

Alternatively or additionally, to the print stations as described above, the processing stations can have additional functional stations comprising a coating station (for structured and/or non-structured coating), a lamination station, a rotary screen printing station, a pick-and-place station and a dispense station. The skilled in the art will appreciate that other types of functional stations required for production of photovoltaic modules may additionally be included in such a roll-to-roll production apparatus and can be part of the present invention.

The controller 16 is communicatively connected with the belt conveyor 2, the feeding station 4, the collecting station 6, the processing stations 8, 10, 12 and the belt sensor 14 for controlling their respective functions as will be described in more detail below.

On the apparatus 1, a roll-to-roll process for manufacturing thin film photovoltaic cells on a substrate (or carrier layer) can be performed. A semi-product strip 20 of a layered structure comprising photovoltaic material and disposed on the substrate is introduced into the apparatus.

An example of the semi-product will be described with reference to FIGS. 2 and 3A and 3B.

From the feeding station 4 the semi-product strip 20 is introduced on the belt conveyor 2 and transported in the direction T of the collection station 6 while passing the processing stations 8, 10, 12.

In the transport direction of the belt conveyor the semi-product strip 20 first passes the scribe station 8 comprising a laser scanner S which is arranged for creating one or more scribe lines in the layered structure by removing material from the layered structure on the substrate. The scribe lines serve as a basis for the so-called P1, P2 and P3 lines as will be described with reference to FIGS. 3A and 3B.

Next, the semi-product strip passes the at least one isolating ink print station 10 which is arranged for printing isolating ink in a portion (i.e., a first number) of the scribe lines. Also, the isolating ink printing station 10 can be configured to print isolating ink elements such as isolating ink lines on a top surface of the layered structure. Such isolating ink elements may be printed adjacent to one or more isolating ink line printed in the first number of scribe lines.

Subsequently, the semi-product strip passes the at least one print station 12 which is arranged for printing conductive ink or a removable ink in a second portion (i.e., a second number) of the scribe lines. Also, the conductive ink printing station 12 can be configured to print conductive ink elements such as conductive ink lines or a conductive or functional ink body on a top surface of the layered structure. Such conductive or functional ink elements may be printed adjacent to one or more conductive ink line printed in the second number of scribe lines. Alternative to this method of applying conductive ink a method can be applied using a removable ink as lift-off compound.

After passing the processing stations, the processed semi-product 20 is collected at the collecting station 6 and transferred to a post processing facility (not shown). In such post processing facility for example a low temperature sinter step for the conductive ink can be carried out. If a TCO interconnection is required as connection over the P1 scribe, a patterned TCO layer is created in the post processing.

In combination, the scribe station(s), isolating ink print station(s) and conductive ink print station(s) are arranged to create individual portions of the layered structure that each function as (thin film) photovoltaic cell and to provide a (series) connection of the photovoltaic cells by creating an interconnection structure in between each pair of adjacent photovoltaic cells.

According to an embodiment of the invention, the scribe station(s), the isolating ink print station(s) and the conductive ink print station(s) are additionally configured for creating a test pattern comprising scribe test lines, isolating ink test lines and conductive ink test lines at a portion of the semi-product spaced apart from the photovoltaic cells created by the processing stations 8, 10, 12. The isolating ink test lines can be disposed in one or more of the scribe test lines and/or on the top surface of the layered structure in the spaced apart portion. Likewise, the conductive ink test lines can be disposed in one or more of the scribe test lines and/or on the top surface of the layered structure in the spaced apart portion.

The apparatus comprises the belt sensor 14 which is arranged to measure a timing signal from the moving belt so as to measure any drift of the belt conveyor mechanism.

According to an embodiment, the belt sensor 14 comprises a marker on the belt of the belt conveyor 2 and a sensing device 14b for sensing the marker on the belt, in which the drift is derived from timing signals from the sensing device.

In a further embodiment, the marker 14a comprises a through hole at a predetermined position in the belt, the sensing device 14b comprises an optical source S at a first surface of the belt, for example above, which is arranged to generate an optical signal using the laser scanner through the through hole 14a when the through hole 14a passes the sensing device 14, and an optical detector D at a second surface of the belt opposite to the first surface, for example below the belt, which is arranged to detect a timing of the optical signal from the laser scanner as it is transmitted through the belt. From the detected timing the timing signal is produced.

Thus an apparatus is provided for producing in a roll-to-roll process thin film photovoltaic cells in a substrate film comprising a substrate or carrier layer with a photovoltaic layer deposited in between a lower and an upper electrode layer, the apparatus comprising a belt conveyor, a feeding station, a collecting station, processing stations, a belt sensing device and a controller; the controller comprising a processing unit and a memory, in which the processing unit is coupled to the memory; the controller being communicatively connected with the belt conveyor, the feeding station, the collecting station, the processing stations and the belt sensing device for controlling their respective functions; the processing stations comprising at least one scribe station, at least one print station for printing isolating ink, and at least one print station for printing an ink selected from a group comprising conductive ink, a phase change ink and a dissolvable ink; in which the processing stations are arranged at respective positions along a transport direction of the belt conveyor in an order to create a serial interconnection structure between the photovoltaic cells, wherein the belt of the belt conveyor is provided with a through hole and the belt sensing device comprises an optical source above one surface of the belt and an optical detector above the opposite surface of the belt, wherein the optical source and the optical detector are aligned in a position that if the through hole is between the optical source and the optical detector, the optical source is in line of sight of the optical detector.

Figure 2:
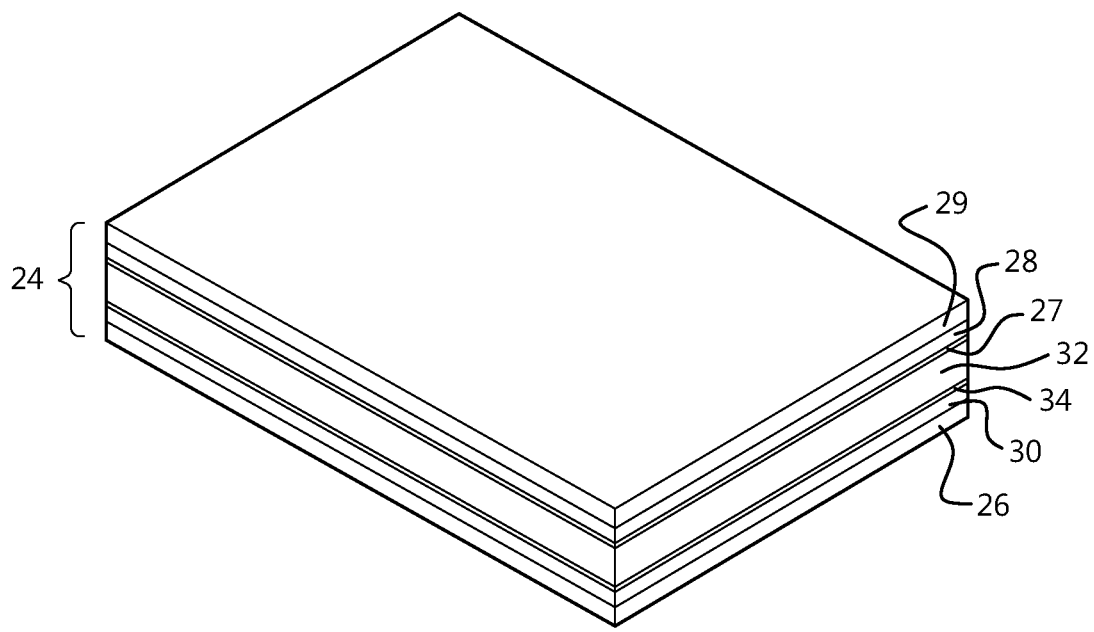
FIG. 2 shows a cross-section of a layered structure from which photovoltaic cells can be created.
Figure 3A:
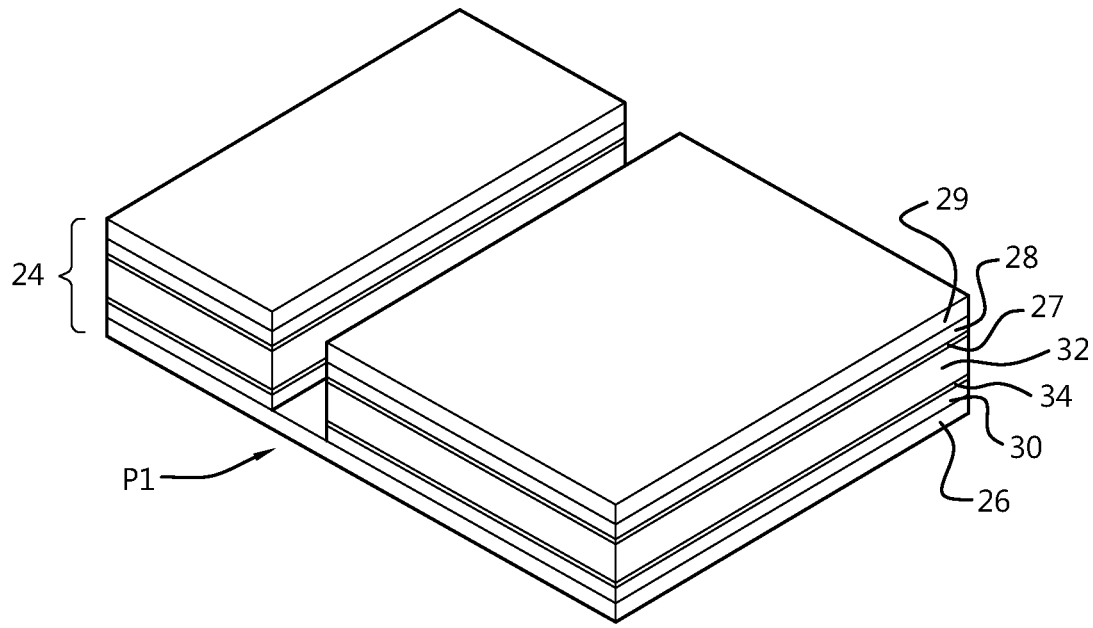
FIGS. 3A and 3B show perspective views of an example of an interconnection structure for photovoltaic cells at different manufacturing stages.
Figure 3B:
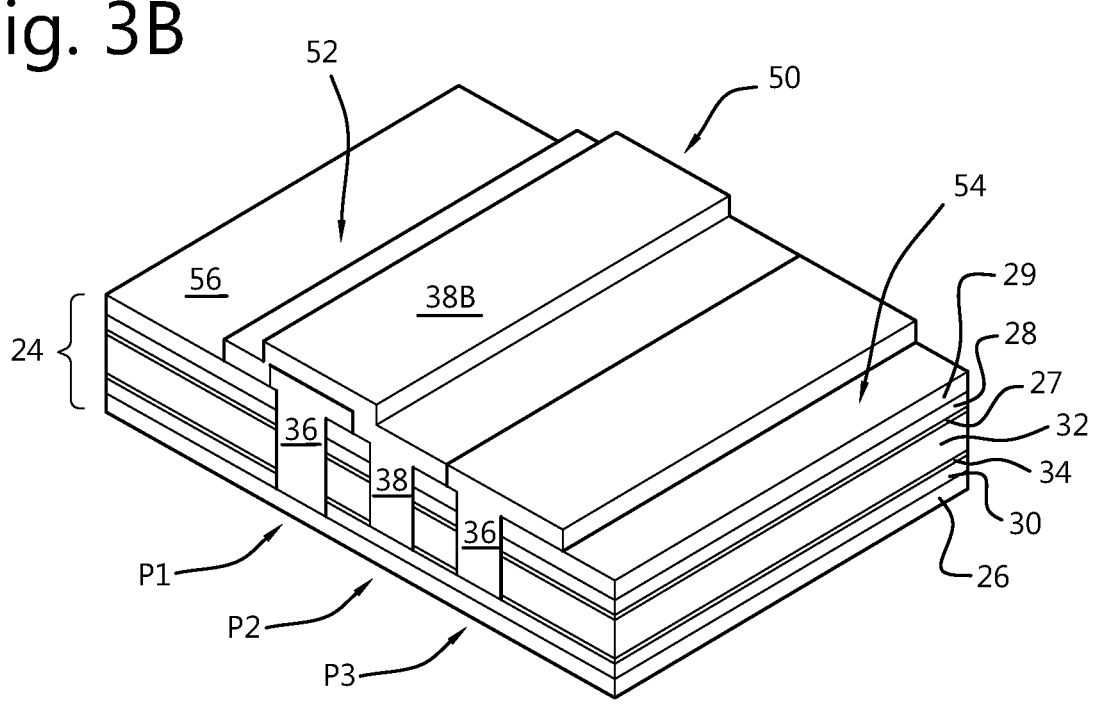

FIG. 2 shows a cross-section of a layered structure 24 from which thin film photovoltaic cells can be created.

The layered structure 24 is placed on a substrate or carrier layer 26. The layered structure 24 comprises a top electrode layer 28, a bottom electrode layer 30 adjacent to the substrate 26. The layered structure 24 has a photo-voltaic active layer 32 and a barrier layer 34 adjacent to the bottom electrode layer 30 interposed between the top electrode layer 28 and the bottom electrode layer 30.

The substrate 26 can be a rigid (e.g. glass) or a flexible substrate. The substrate 26 can be transparent or opaque.

In some embodiments, the top electrode layer 28 can comprise a (intrinsic) ZnO layer or optionally a stack of a $ZnO_2Al$ layer and a ZnO layer. A junction layer of CdS (Cadmium Sulfide) or an alternative material may be used between the photo-voltaic active layer 32 and the top electrode layer 28, in such a way that the ZnO layer borders on the CdS layer or alternative material layer, and if present the $ZnO_2Al$ layer borders on the ZnO layer. A transparent conductive oxide layer 29, created during post processing, is arranged on the top electrode layer 28.

The substrate 26 may initially be supplied on a roll as a thin, pliable and possibly transparent foil. The substrate 26 may then be subjected through a high-speed manufacturing process for depositing the layered structure 24 onto the substrate 26. The manufacturing process may take place in atmospheric conditions and does not require a vacuum.

In some embodiments, the photo-voltaic active layer 32 may comprise a CIGS (Copper indium gallium (di) selenide) layer. Alternatively, the photo-voltaic active layer 32 may comprise a perovskite material, comprising without limitation perovskite material ($APbI_3$) where "A" consists of three or two different cations (hereafter: triple cation perovskite or double cation perovskite) or a MAPb13 perovskite (MAPb13 perovskite: methyl ammonium lead iodide perovskite) or a different perovskite material for example, free of Pb. Alternatively, the photo-voltaic active layer 32 may comprise a combination of a CIGS layer and one or more perovskites.

The bottom electrode layer 30 comprises a Molybdenum layer. The barrier layer 34 comprises a MoSe2 layer. The MoSe2 layer forms an interface layer between the bottom electrode layer 30 and the photo-voltaic active layer 32. Alternatively, the bottom electrode layer may comprise another conductive material.

FIG. 3 shows a perspective view of an example of an interconnection structure 50 for photovoltaic cells.

As explained with reference to FIG. 1, an interconnection structure 50 is created by the combination of at least a scribe station(s), isolating ink print station(s) and (conductive) ink print station(s) of the apparatus as described above.

As shown as example, the interconnection structure 50 between a pair of adjacent photovoltaic cells, denoted here as a first photovoltaic cell 52 and a second photovoltaic cell 54, comprises interruptions of the layered structure by P1, P2 and P3 scribes.

At the side of the first photovoltaic cell 52 a P1 scribe is arranged which extends from the top surface 56 of the layered structure 24 to the surface of the substrate 26. The P1 scribe line is filled with isolating ink 36 which in addition protrudes and covers a portion 58 of the top surface next to the P1 scribe line.

At the side of the second photovoltaic cell 54 a P3 scribe is arranged which extends from the top surface 56 to the level of the bottom electrode layer 30. The P3 scribe line is filled with isolating ink 36 which in addition protrudes and covers a portion 60 of the top surface next to the P3 scribe line.

Intermediate the P1 and P3 scribe lines the P2 scribe line is arranged. The P2 scribe line extends from the top surface to the bottom electrode layer 30 and is filled with conductive ink 38. In addition, a conductive body 38B is disposed between the top surface of the first photovoltaic cell 52 and the P2 scribe line. In this manner, the top electrode layer 28 is connected in series to the bottom electrode layer 30 of the second photovoltaic cell 54. The P1 scribe provides isolation between the bottom electrode layer of the first photovoltaic cell 52 and the bottom electrode layer of the second photovoltaic cell 54. The P3 scribe provides isolation between the top electrode layer of the first photovoltaic cell 52 and the top electrode layer of the second photovoltaic cell 54.

It is known to the skilled in the art that due to positioning errors in the interconnection structure 50, induced by any of the processing stations, a positioning error or misalignment may occur between any two of the P1 scribe, P2 scribe, P3 scribe, one or more of the conductive ink lines and/or one of more of the isolating ink lines. Any of these positioning errors potentially results in a functional defect, i.e., can adversely the function of the interconnection structure 50.

For example, a displacement of the P2 scribe to a position outside the area between the P1 scribe and P3 scribe (with all isolating ink lines and conductive ink body in correct locations), results in a loss of a photovoltaic cell as the connection between the first and second photovoltaic cells 52, 54 is absent.

Also, if the isolating ink 36 does not seal the P1 scribe effectively the conductive ink 38 can penetrate the P1 scribe which thus connects the P1 and P2 scribes. This result in a repair of the (molybdenum) electrode in the P1 scribe and a complete shunt of the first and second photovoltaic cells. The positioning error would cause the first and second photovoltaic cells connected in this manner to act as a resistor.

Furthermore, the contact of the conductive ink from the top transparent conductive oxide to the P2 scribe can go wrong in several ways. For example, the conductive ink body 38B does not bridge the P1 scribe or the P2 scribe is not filled with conductive ink 38. In these cases, there is no connection between the top electrode layer of the first photovoltaic cell 52 and the bottom electrode layer of the second photovoltaic cell 54, resulting in an isolation of the first and second photovoltaic cells 52, 54.

Another positioning error involves that the conductive ink body 38B bridges the P2 scribe, extends on both the top electrode layer of the first photovoltaic cell and the top electrode layer of the second photovoltaic cell. Similarly, if the P1 scribe is (partially) filled with conductive ink 38 and is connected to the P2 scribe by means of a (correctly formed) conductive ink body 38B. Or if the P3 scribe is partially filled with conductive ink 38 and connects to the P2 scribe that is normally filled with conductive ink 38. The latter three possibilities result in a shunt of the first and second photovoltaic cells 52, 54.

Figure 4A:
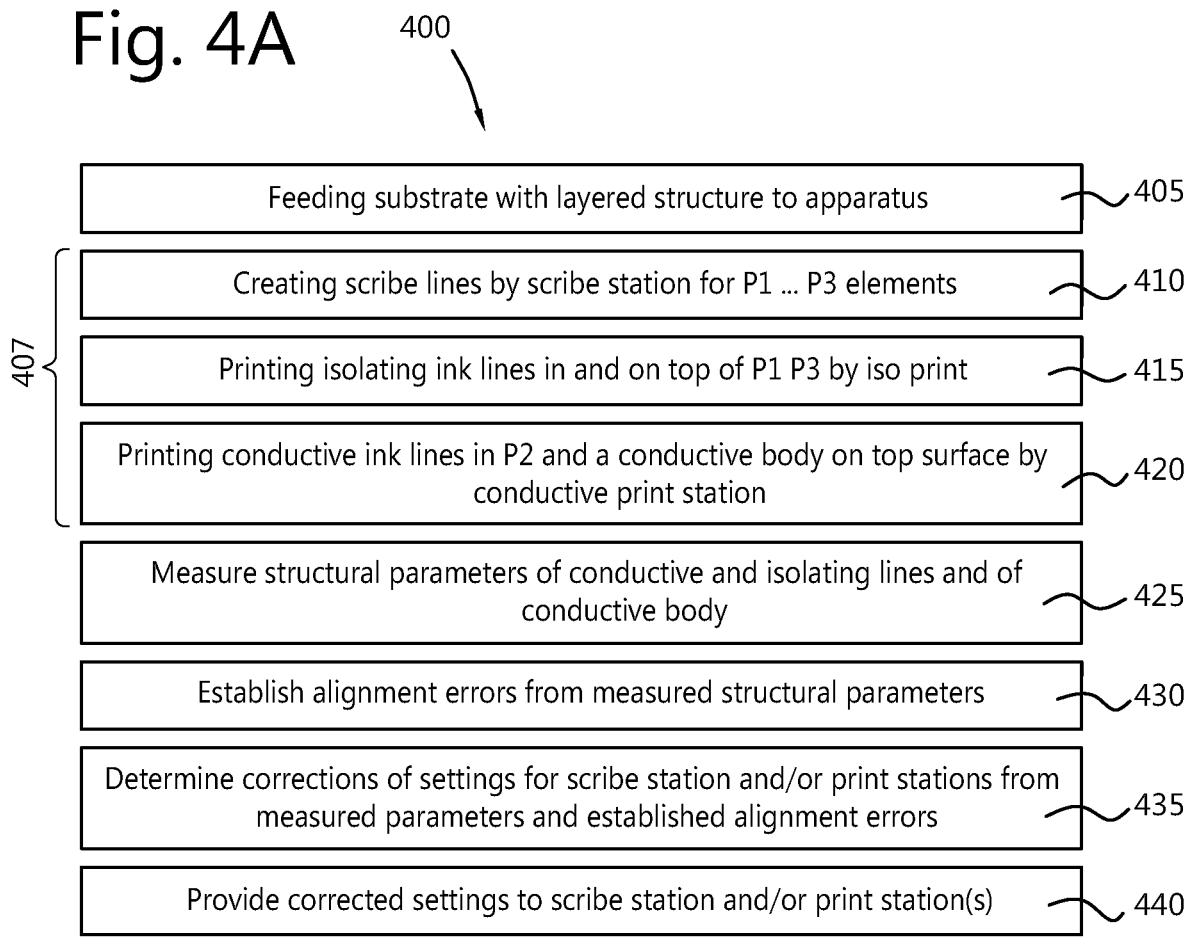

FIGS. 4A, 4B and 4C shows block diagram for a method according to an embodiment of the invention.

To overcome the positioning errors, the method of the present invention provides that structural parameters of the structural elements of the interconnection structure including the P1, P2, P3 scribes, the isolating ink lines and conductive ink lines of the created interconnection structure, are measured.

Alternatively, the structural parameters can be obtained from the positions of structural test elements including test scribes, test isolating ink lines and test conductive ink lines or of the edges thereof in a test pattern.

The structural parameters comprise (relative) position, width, and position of edges. In addition, the structural parameters comprise one or more of the variances of the position, the width, and the position of edges.

Measuring the structural parameters can be done in many ways known to the skilled in the art, for example, (electron-) optically by (electron) microscope, electrically by resistance, or mechanically by for example a profiler.

From the measured structural parameters, positioning errors are established. By taking into account which of the structural elements (or one or more of its edges) are relatively displaced in the interconnection structure, the positioning errors can be classified in terms of functional defect for example in the manner as described above.

Moreover, by taking into account variance of one or more of the measured structural parameters, a probability for the occurrence of the associated functional defect can be estimated.

Depending on the measured positioning error and the nature of the functional defect, a correction of the settings of one or more of the processing stations is provided.

The settings can relate to the relative timing of the involved processing station(s) for the activation and deactivation of the respective function so as to reduce the positioning error of a structural element of the interconnection structure. Also the settings may be corrected to adapt or modify a width of a structural element or a position of one or both edges of the structural element in the interconnection structure.

In a further embodiment, the correction of the settings of one or more processing stations is performed only when the probability level of occurrence of the defect exceeds a predetermined threshold level. This has the advantage that if a chance of occurrence of a particular defect is insignificant, unneeded adjustment of the processing stations in apparatus and the executed manufacturing process can be avoided.

In FIG. 4A a first embodiment 400 of the method is illustrated.

The method comprises a first step in which the semi-product of the substrate with the layered structure is introduced into the apparatus.

In a number of steps 410-420 that are carried out while the semi-product moves 407 through the apparatus, scribe lines for the P1, P2 and P3 scribes are created 410 by the scribe station(s), subsequently isolating ink lines are formed 415 in and on top of the P1 and P3 by the isolating ink print station(s) and conductive ink lines are printed 420 in the P2 together with a conductive ink body 38B on the surface across the isolated P1 scribe line by means of the conductive ink print station(s).

Next, the method comprises a measurement 425 of the structural parameters as explained above. According to the invention, the measurement of the structural parameters can be done in on-line or off-line mode.

In an embodiment, where measurement is done on-line, the apparatus 1 is provided with an image recording device or a camera 18, that is configured to record image of the semi-product after the formation of the interconnection structure.

Images taken by the camera are processed either automatically or manually to obtain values for the structural parameters of the structural elements of the interconnection structure.

Alternatively, measurement of the structural parameters can be done off-line by analyzing a sample of the semi-product or a test sample.

In both the on-line and off-line measurement, the samples can comprise either the interconnection structure 50 and/or a structure consisting of test lines in a test pattern.

From the data of the structural parameters the positioning error(s) is (are) determined 430 optionally including the associated variance(s).

Since the positioning error(s) is typically relative to a main structural element, adjustment values for correction of settings of one or more of the processing stations are determined 435 with respect to the main structural element. As main structural element preferably the structural element created by a main or most stable processing step is defined. In an exemplary embodiment, the most stable processing step relates to the creation of the P1 scribe by the scribe station. In that case, correction of the settings of the other processing stations can be carried out with respect to the position of the P1 scribe.

In a last step 440, correction of the settings of the one or more processing stations is done by adjustment of the processing stations. The adjustments can be done either manually by an operator or automatically for example by the controller device 16 that communicatively coupled to the processing stations.

This procedure 400 can be repeated as required.

In case of automatically analyzing and automatically adjusting the settings of the processing stations, the method provides the advantage that the processing stations can be controlled during the manufacturing process which allows corrections in the processing almost immediately after a positioning error occurs.

In FIG. 4B a second embodiment 450 of the method is illustrated.

The second embodiment of the method corresponds to a large extent with the first embodiment, but alternatively or additionally with respect to the first embodiment, while the semi-product is moving 407 through the apparatus, in additional steps 412, 417, 422, a test pattern is created in a portion of the semi-product which comprises as structure test elements, scribe test lines, isolating ink test lines and conductive ink test lines. In the second embodiment, positioning errors are now determined (also) 430 in relation to the structural parameters of the structural test elements. Again, analysis and/or adjustment of the processing stations can be done manually or automatically.

The advantage of applying a test pattern for determining positioning errors is that in a design of the test pattern overlapping features of the interconnection structure 50 such as the conductive ink body 38B bridging the P1 scribe between the first photovoltaic cell 52 and the second photovoltaic cell 54 can be avoided, which simplifies the measurement on the structural test elements.

This procedure 450 can be repeated as required.

In FIG. 4C a block diagram 500 is shown for a method to be carried by the apparatus 1 in case that the apparatus comprises the belt sensor 14. This method may be carried out in conjunction with any of the methods shown in FIGS. 4A and 4B, but also independently from any of these methods.

In a first step 510 the method comprises that a signal is measured that relates to the movement of the belt of the belt conveyor 2. As described above, in an embodiment the apparatus 1 comprises the belt sensor 14, has an optical source S (in an embodiment the laser scanner) and an optical detector 14b, D, that are placed opposite to each other with the belt arranged in between. The belt is provided with at least one through hole that passes between the optical source S and the optical detector D, when the belt is moving. In this manner, a timing signal is obtained.

In a next step 520, from the timing signal a drift (value) with respect to the belt moving speed can be determined as will be known by the skilled in the art.

Finally, an adjustment or correction for the belt drift is provided in step 530 to the processing stations including the scribe station(s) and the print stations for conductive ink and isolating ink, in which the adjustment is based on the determined drift (value). Also, the adjustment or correction can be provided to the other possibly present processing stations such as the coating station (for structured/non structured coating), the lamination station, the rotary screen printing station, the pick-and-place station and the dispense station as described above.

This procedure 500 can be repeated as required.

Figure 5:
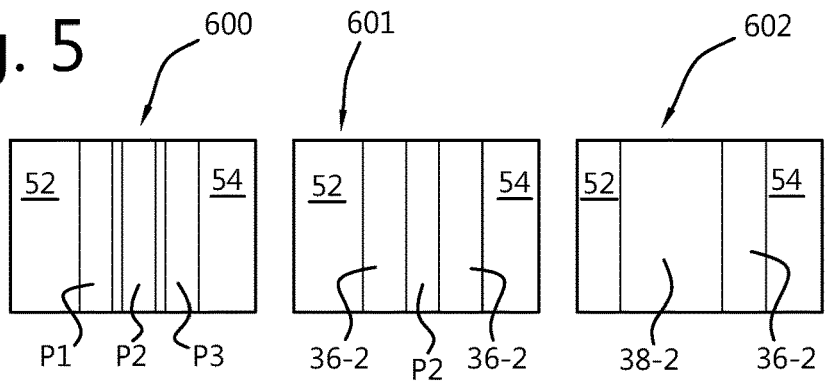
FIG. 5 shows schematically a test pattern on a substrate film for producing photovoltaic cells in a roll-to-roll process.

FIG. 5 shows schematically a test pattern 600, 601, 602 on a substrate film for producing photovoltaic cells in a roll-to-roll process.

As mentioned above with reference to FIG. 4A-4C using a test pattern for determining positioning errors avoids the difficulty of analyzing structural elements of the interconnection structure 50 in which overlapping features complicate measurements. Moreover, using test patterns allows that the test patterns can be evaluated using electrical measurements or even a dark and light IV measurement For this reason, in an embodiment of the invention the method provides that a test pattern 600, 601, 602 is created in a portion of the semi-product, for example on an edge of the semi-product.

The test pattern comprises a first part that comprises test lines running vertically i.e., parallel to the transport direction and a second part comprising test lines running horizontally, i.e., perpendicular to the transport direction. The test lines in each of the vertical and horizontal direction comprise P1, P2, P3 scribe test lines (left portion 600), P1, P2, P3 scribe test lines with P1 and P3 filled with isolating ink, denoted as isolating ink test lines (centre portion 601) and P1, P2, P3 scribe test lines with P1, P3 filled with isolating ink (line 36-2) and P2 filled with conductive ink with the conductive ink also covering a region over the P1 scribe line, the conductive ink print denoted as conductive ink test lines 38-2 (right portion 602 of FIG. 5).

Figure 6A:
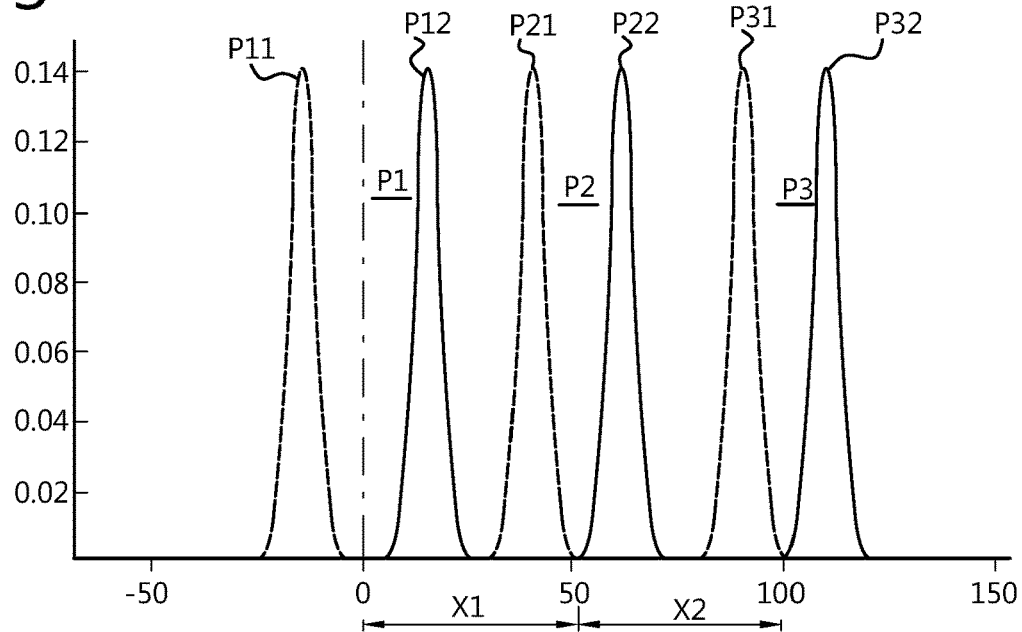
FIG. 6A, 6B show schematically a probability density function for the position of structural elements in the interconnection structure, and FIG. 7.0-7.18 show a schematic for determining functional defects from positioning errors.
Figure 6B:
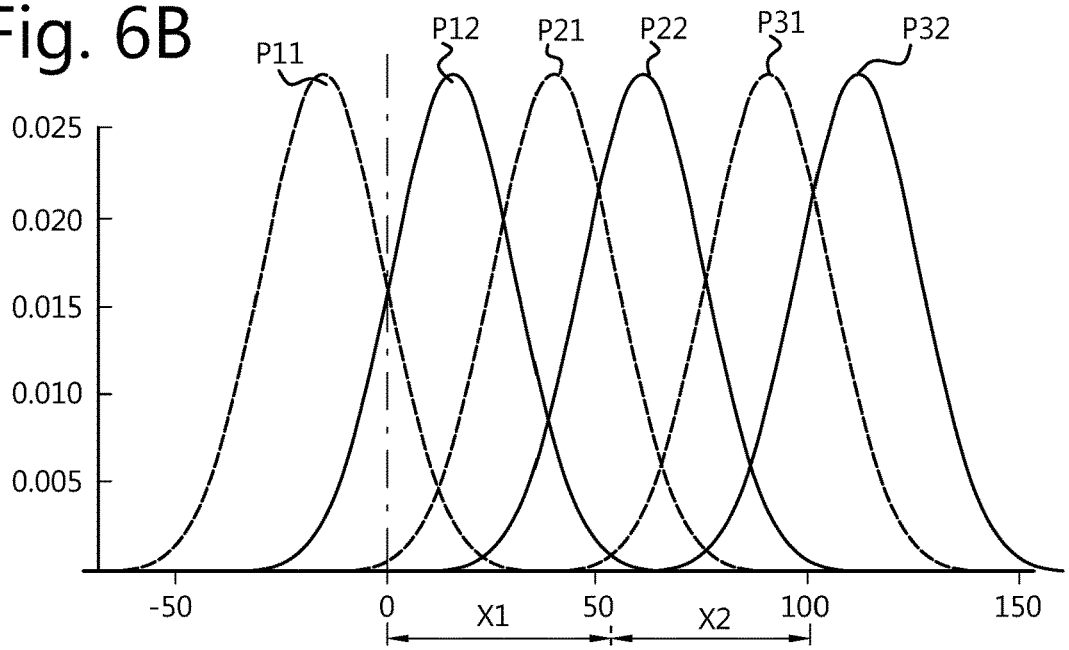

FIGS. 6A and 6B show schematically a probability density function for the position of structural elements in the interconnection structure.

As mentioned above, each of the measured structural elements is described by structural parameters comprising a measured position, width (edge positions) and variance of these measured features.

In FIGS. 6A and 6B, an example cross-sectional configuration of P1, P2, P3 scribes is shown as represented by the edges P11, P12; P21, P22; P31, P32 of the respective scribe lines P1, P2, P3. Each edge is represented by a probability density function which is defined by a center position and a width distribution derived from the variance of the edge position along the length of the respective scribe line.

Using normal distribution for both laser position and spot size (scribe width) of the scribe station these edges can be modelled and made visible using a probability density function (PDF). The PDF data are based on measurements of the laser pulse position and width and the variation along a standard line length created with an overlap.

In FIG. 6A a PDF is shown for an example of P1, P2 and P3 edges in which the variance of the edges is relatively small in comparison with the pitch of the scribe lines. In FIG. 6A a pitch X1 between P1 and P2 is 50 μm, and a pitch X2 of 50 μm between P2 and P3. The width of P1 is 30 μm. The width of P2 and P3 is 20 μm. The variance of the positions of each scribe is 2 μm. The variance of the width of each scribe is 2 μm.

However, if the variance becomes larger, then an overlap between an edge of the P2 scribe and the facing edge of the P3 scribe is likely to occur.

Two situations may occur: in a first situation, the width of the isolating ink in the P3 scribe is reduced as result of the P2 overlap, but has no effect if the isolating ink remains in the P3 scribe. From the overlap of the density functions a probability of functional defects can be calculated. In a second situation as shown in FIG. 6B the variance is so much larger that the overlap of P2 over P3 is virtually complete and isolating ink may be absent from the P3 scribe. Again, the probability of functional defects for this situation can be calculated from the density functions.

In FIG. 6B, as an example, the pitch between P1 and P2 is X1=50 μm, and X2=50 μm between P2 and P3. The width of P1 is 30 μm. the width of P2 and P3 is 20 μm. the variance of the positions of each scribe is 10 μm. The variance of the width of each scribe is 10 μm.

As will be appreciated, if the results of the measurements indicate that variances are relatively large and the density functions are overlapping too much, a larger pitch between the P1, P2 and p3 scribes can reduce the probability of functional defects.

It is noted that from the probability density function the number of shunts per meter can be estimated as follows. The pulse frequency of the scribe laser (laser scanner) and the firing frequency of the inkjet printer(s) creates the smallest time frame to look at. But in reality, the scribe laser does not fire randomly within its distribution and the inkjet printer forms a line due to ink adhesion and wetting. This means that a single event that could create a shunt has a much lower frequency than the scribe laser and inkjet printer frequencies. We can circumvent this by using a potential shunt density and use that to calculate the probabilities of defects on a larger group. The potential shunt density is defined here as the probability density function times the maximum frequency of the inkjet printer and laser systems divided by the laser scan speed (laser) or (belt speed) to calculate the number of shunts per mm. These single events do not automatically result in a shunt. But grouped together to a larger area this would be the case. The probabilities of a minimum shunt size can be fitted with the actual measured data in order to find the minimum number of potential shunts that are necessary to create a shunt.

It is noted that if shunts are close to each other the damage is less than if two shunts are located further apart. The best way to counteract that is to use an inactive length for every small shunt. If a second shunt is within this inactive length the extra shunting is only half of the ineffective length. If the sum of all ineffective lengths is larger than a percentage of the cell length the cell is called ineffective.

FIGS. 7.0-7.18 illustrate a schematic for determining functional defects from positioning errors. From FIG. 3 it can be derived that to establish if the interconnection structure 50 is functional, the main requirement is that the top electrode layer of the first photovoltaic cell 52 connects to the bottom electrode layer of the second photovoltaic cell 54. Based on this, the interconnection structure 50 can be classified by enumerating all combinations of connections from the top and/or bottom electrode layer of the first photovoltaic cell 52 to the top and/or bottom electrode layer of the second photovoltaic cell 54.

In FIG. 7.0-7.18, all possible combinations of connections between one or more electrode layers of the first photovoltaic cell and one or more of the electrode layers of the second photovoltaic cell are shown in a schematic side view.

Each of the FIGS. 7.0-7.18 shows the first photovoltaic cell 52 indicated schematically by the top electrode layer 28 and the bottom electrode layer 30. Likewise, the second photovoltaic cell 54 indicated schematically by the top electrode 28' layer and the bottom electrode layer 30', is shown adjacent to the first photovoltaic cell 52, separated by an intermediate zone where the interconnection structure 50 is located.

In each of the FIGS. 7.0-7.18 the connection by a conductive ink element is indicated by one or more lines 70, 71, 72, 73, 74, 75.

FIG. 7.0 shows a functional interconnection structure 50 connecting 70 the top electrode layer 28 of the first photovoltaic cell 52 with the bottom electrode layer 30' of the second photovoltaic cell 54.

FIG. 7.1 shows an interconnection scheme in which the bottom electrode layer 30 of the first photovoltaic cell 52 is connected 70 with the top electrode layer 28' of the second photovoltaic cell 54. This results in an additional resistance in the interconnection structure 50.

FIG. 7.2 depicts an interconnection scheme in which the top electrode layer 28 of the first photovoltaic cell 52 is connected with the top electrode layer 28' of the second photovoltaic cell 54. This results in a cell elimination.

FIG. 7.3 depicts an interconnection scheme in which the bottom electrode layer 30 of the first photovoltaic cell 52 is connected with the bottom electrode layer 30' of the second photovoltaic cell 54. This also results in a cell elimination.

FIGS. 7.4 and 7.5 depict shunts in either the second photovoltaic cell 54 or the first photovoltaic cell 52. A shunt occurs if the top electrode layer 28; 28' and the bottom electrode layer 30; 30' within the same photovoltaic cell 52; 54 are interconnected 72; 73.

FIGS. 7.6-7.11 depict interconnection schemes in which double shunts occur.

In FIG. 7.6, in the first photovoltaic cell 52 the top electrode layer 28 is connected 73 to the bottom electrode layer 30, and in the second photovoltaic cell 54 the top electrode layer 28' is connected 72 to the bottom electrode layer 30'.

In FIG. 7.7, both the top electrode layer 28 and the bottom electrode layer 30 of the first photovoltaic cell 52 are connected 70, 75 to the bottom electrode layer 30' of the second photovoltaic cell 54.

In FIG. 7.8, both the top electrode layer 28' and the bottom electrode layer 30' of the second photovoltaic cell 54 are connected 74, 75 to the bottom electrode layer 30 of the first photovoltaic cell 52.

In FIG. 7.9, both the top electrode layer 28' and the bottom electrode layer 30' of the second photovoltaic cell 54 are connected 70, 71 to the top electrode layer 28 of the first photovoltaic cell 52.

In FIG. 7.10, both the top electrode layer 28 and the bottom electrode layer 30 of the first photovoltaic cell 52 are connected 71, 74 to the top electrode layer 28' of the second photovoltaic cell 52.

In FIG. 7.11, the top electrode layer 28 of the first photovoltaic cell 52 is connected 74 to the bottom electrode layer 30' of the second photovoltaic cell 54, while the bottom electrode layer 30 of the first photovoltaic cell 52 is connected 70 to the top electrode layer 28' of the second photovoltaic cell 54. In addition, the connections 70, 74 may interconnect in between.

FIGS. 7.12-7.15 depict so-called triple shunts. In FIG. 7.12, the top electrode layer 28 of the first photovoltaic cell 52 is connected 71 to the top electrode layer 28' of the second photovoltaic cell 54. The bottom electrode layer 30 of the first photovoltaic cell 52 is connected 75 to the bottom electrode layer 30' of the second photovoltaic cell 54. The top electrode layer 28' of the second photovoltaic cell 54 is connected 72 with the bottom electrode layer 30' of the second photovoltaic cell 54.

In FIG. 7.13, the top electrode layer 28 of the first photovoltaic cell 52 is connected 73 to the top electrode layer 28' of the second photovoltaic cell 54. The bottom electrode layer 30 of the first photovoltaic cell 52 is connected 75 to the bottom electrode layer 30' of the second photovoltaic cell 54. The top electrode layer 28 of the first photovoltaic cell 52 is connected 72 with the bottom electrode layer 30 of the first photovoltaic cell 52.

In FIG. 7.14, the bottom electrode layer 30 of the first photovoltaic cell 52 is connected 75 to the bottom electrode layer 30' of the second photovoltaic cell 54. The top electrode layer 28 of the first photovoltaic cell 52 is connected 73 with the bottom electrode layer 30 of the first photovoltaic cell 52. The top electrode layer 28' of the second photovoltaic cell 54 is connected 72 with the bottom electrode layer 30' of the second photovoltaic cell 54.

In FIG. 7.15, the top electrode layer 28 of the first photovoltaic cell 52 is connected 71 to the top electrode layer 28' of the second photovoltaic cell 54. The top electrode layer 28 of the first photovoltaic cell 52 is connected 73 with the bottom electrode layer 30 of the first photovoltaic cell 52. The top electrode layer 28' of the second photovoltaic cell 54 is connected 72 with the bottom electrode layer 30' of the second photovoltaic cell 54.

FIG. 7.16 depicts a quadruple shunt. The top electrode layer 28 of the first photovoltaic cell 52 is connected 71 to the top electrode layer 28' of the second photovoltaic cell 54. The top electrode layer 28 of the first photovoltaic cell 52 is connected 73 with the bottom electrode layer 30 of the first photovoltaic cell 52. The top electrode layer 28' of the second photovoltaic cell 54 is connected 72 with the bottom electrode layer 30' of the second photovoltaic cell 54. The bottom electrode layer 30 of the first photovoltaic cell 52 is connected 75 with the bottom electrode layer 30' of the second photovoltaic cell 54.

FIG. 7.17 depicts a full isolation in which no connections exist between the first photovoltaic cell 52 and the second photovoltaic cell 54.

FIG. 7.18 depicts a repair, in which the top electrode layer 28 of the first photovoltaic cell 52 is connected 71 to the top electrode layer 28' of the second photovoltaic cell 54, and the bottom electrode layer 30 of the first photovoltaic cell 52 is connected 75 with the bottom electrode layer 30' of the second photovoltaic cell 54.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims.

The skilled in the art will appreciate that other arrangements of the photovoltaic cells and/or the interconnection structure and/or the test pattern are conceivable in accordance with the presented inventive concept, for example, inverted structure photovoltaic cells or tandem photovoltaic cells.

In particular, combinations of specific features of various aspects of the invention may be made. An aspect of the invention may be further advantageously enhanced by adding a feature that was described in relation to another aspect of the invention.

In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

In the foregoing description of the figures, the invention has been described with reference to a specific embodiment thereof. It will, however, be evident that various modifications and changes may be made thereto without departing from the scope of the invention as summarized in the attached claims.

In addition, modifications may be made to adapt a material or substance of the substrate film or the photovoltaic cells to the teachings of the invention without departing from the essential scope thereof. The photovoltaic material and/or the substrate material as described above may encompass variants or modifications in structure or composition.

The invention claimed is:

1. Method for producing in a roll-to-roll process modules of thin film photovoltaic cells in a substrate film on a substrate, the modules comprising the substrate with the substrate film comprising a photovoltaic layer deposited in between a lower and an upper electrode layer, by using an apparatus comprising a belt conveyor and a plurality of processing stations, in which the processing stations comprise scribe stations and print stations and are arranged at respective positions along a transport direction of the belt conveyor in an order to create an interconnection structure between the photovoltaic cells comprising an arrangement of structural elements comprising one or more conductive scribe lines, one or more isolating scribe lines and a conductive body for providing a connection between adjacent thin film photovoltaic cells, wherein the method comprises:
 a) transporting the substrate at a predetermined speed along the belt conveyor in the transport direction;
 b) while the substrate passes the processing stations: creating by means of the processing stations using timing for activation and deactivation of their respective function, the interconnection structure in the substrate film and/or optionally on a portion of the substrate film away from the interconnection structure a test pattern of elongated test structures comprising conductive scribe test lines, isolating scribe test lines and conductive printed test lines with each of the test lines associated with a respective processing station;
 c) subsequently measuring each of the structural elements in the interconnection structure and determining structural parameters of each of the structural elements, and/or if the test pattern was created, measuring each of the elongated test structures and determining structural parameters of each of the test structures,
the structural parameters of each of the structural elements and/or each of the test structures being selected from a group comprising relative position, width, variance of width, relative position of line edges;
 d) based on the structural parameters establishing an positioning error, which is associated with an occurrence of a functional defect in the interconnection structure and
 e) based on the established positioning error, providing a correction of settings of one or more of the processing stations and/or the belt conveyor.

2. The method according to claim 1, wherein said settings comprise one or more settings from a group comprising optical settings for an optical processing station, drive settings for a drive of a processing stations, print settings for a printing station, settings for a drive of the belt conveyor, and settings for an inspection station.

3. The method according to claim 1, wherein establishing the positioning error comprises determining an overlap for each pair of lines, based on measurement of said structural parameters.

4. The method according to claim 1, wherein the method comprises that a correction of the timing for activation and/or for deactivation is provided to said one or more of the processing stations, based on the overlap and based on the predetermined speed of the belt conveyor.

5. The method according to claim 4, wherein one of the processing stations is a main processing station and the correction of timing for activation and/or for deactivation is made for each of the other processing stations relative to the timings for activation and for deactivation of the main processing station.

6. The method according to claim 1, further comprising:
 measuring a drift of the predetermined speed of the belt conveyor;
 determining a timing correction based on the measured drift;
 and adjusting the timing for activation and for deactivation for each processing station,
 using the timing correction,
 wherein the apparatus comprises a marker on the belt of the belt conveyor and a sensing device for sensing the marker on the belt, in which the drift is derived from or measured by timing signals from the sensing device.

7. The method according to claim 6, wherein the method comprises providing a through hole at a predetermined position in the belt as the marker, and the measurement of the drift comprises:
 generating an optical signal generated by an optical source at a first surface of the belt through the through hole, and
 detecting a timing of the optical signal by an optical detector at a second surface of the belt opposite to the first surface.

8. The method according to claim 1, wherein the test pattern comprises vertical isolating scribe test lines, vertical conductive scribe test lines and vertical conductive printed test lines extending in the transport direction and horizontal isolating scribe test lines, horizontal conductive scribe test lines and horizontal conductive printed test lines extending perpendicular to the transport direction.

9. The method according to claim 8, wherein each line in the test pattern is respectively described by a probability density function based on a position and a line width, and a variance of the position, the position, line width and variance being derived from said structural parameters.

10. The method according to claim 3, wherein the overlap between each pair of lines or each pair of test lines is established based on the relative positions of the edges of each line or test line in the respective pair.

11. The method according to claim 1, wherein the method comprises:
 creating classifications of positioning errors of the processing stations for each pair of lines or test lines, and storing the classifications in a lookup table or memory.

12. The method according to claim 11, wherein the classifications are associated with shunts and the method comprises: predetermining control actions to control the apparatus based on the specific classifications, and storing the predetermined control actions in the lookup table or the memory.

13. The method according to claim 9 wherein the functional defect is one from a group comprising a single, double, triple or quadruple shunt between adjacent photovoltaic cells.

14. The method according to claim 9, comprising:
 estimating a probability for the positioning error by using the probability density function of each line in the pair of lines or test lines.

15. The method according to claim 9, wherein establishing the positioning error comprises determining an overlap for each pair of lines, based on measurement of said structural parameters, further comprising:

based on the probability for the established positioning error, determining if the correction of the settings for said one or more of the processing stations is required, and only if the correction is required, applying the correction to said one or more of the processing stations.

16. The method according to claim 2, wherein establishing the positioning error comprises determining an overlap for each pair of lines, based on measurement of said structural parameters.

* * * * *